(12) United States Patent
Coushaine et al.

(10) Patent No.: US 7,207,695 B2
(45) Date of Patent: Apr. 24, 2007

(54) LED LAMP WITH LEDS ON A HEAT CONDUCTIVE POST AND METHOD OF MAKING THE LED LAMP

(75) Inventors: Charles M. Coushaine, Rindge, NH (US); Thomas Tessnow, Weare, NH (US); Fred Peterson, Sanbornton, NH (US); Kim Albright, Warner, NH (US); Florence Taitel, Hooksett, NH (US); Howard Eng, Hancock, NH (US)

(73) Assignee: Osram Sylvania Inc., Danvers, MA (US)

( * ) Notice: Subject to any disclaimer, the term of this patent is extended or adjusted under 35 U.S.C. 154(b) by 170 days.

(21) Appl. No.: 10/993,436

(22) Filed: Nov. 22, 2004

(65) Prior Publication Data

US 2006/0109661 A1 May 25, 2006

(51) Int. Cl.
*F21V 11/00* (2006.01)
(52) U.S. Cl. ................. 362/240; 362/294; 362/800
(58) Field of Classification Search ............... 362/240, 362/241, 247, 294, 545, 547, 800; 439/59, 439/61
See application file for complete search history.

(56) References Cited

U.S. PATENT DOCUMENTS

| | | | | |
|---|---|---|---|---|
| 5,644,475 A | * | 7/1997 | Woychik et al. | 361/767 |
| 6,231,207 B1 | * | 5/2001 | Kennedy et al. | 362/158 |
| 6,343,871 B1 | * | 2/2002 | Yu | 362/250 |
| 6,425,678 B1 | * | 7/2002 | Verdes et al. | 362/244 |
| 6,435,459 B1 | * | 8/2002 | Sanderson et al. | 246/473.3 |
| 6,481,130 B1 | | 11/2002 | Wu | |
| 6,525,668 B1 | * | 2/2003 | Petrick | 340/815.45 |
| 6,538,899 B1 | * | 3/2003 | Krishnamurthi et al. | 361/788 |
| 6,709,132 B2 | * | 3/2004 | Ishibashi | 362/249 |
| 6,773,138 B2 | | 8/2004 | Coushaine | |
| 7,014,337 B2 | * | 3/2006 | Chen | 362/240 |
| 7,048,412 B2 | * | 5/2006 | Martin et al. | 362/247 |
| 2004/0165387 A1 | | 8/2004 | Zhang | |
| 2005/0052870 A1 | | 3/2005 | Vamberi | |

FOREIGN PATENT DOCUMENTS

| | | |
|---|---|---|
| EP | 1 298 383 A2 | 4/2003 |
| EP | 1 371 901 A2 | 6/2003 |
| EP | 1 353 120 A2 | 10/2003 |
| EP | 1 400 747 A2 | 3/2004 |

\* cited by examiner

*Primary Examiner*—Renee Luebke
*Assistant Examiner*—Gunyong T. Lee
(74) *Attorney, Agent, or Firm*—Young & Thompson

(57) ABSTRACT

A lamp, and a method of assembling the lamp, includes a heat sink, a heat conductive post extended longitudinally from the heat sink where the post has longitudinal faces that each has a longitudinally extending slot therein, a metal clad circuit board slid into each slot so that each circuit board is in thermal communication with the post where each circuit board has an exterior surface with an LED thereon, and a cap on top of the post where the cap abuts lateral end surfaces of the circuit boards. The cap may hold the circuit boards in their respective slots.

12 Claims, 6 Drawing Sheets

US 7,207,695 B2

LED LAMP WITH LEDS ON A HEAT CONDUCTIVE POST AND METHOD OF MAKING THE LED LAMP

BACKGROUND OF THE INVENTION

The present invention relates to a lamp and a method of making a lamp in which a light emitting diode (LED) is the light source. This application relates to copending application Ser. No. 10/647,682 titled LED LAMP WITH INSERTABLE LED SUBSTRATES AND METHOD OF MAKING THE LAMP filed on Aug. 25, 2003 and to copending application Ser. No. 10/647,831 titled LED LAMP WITH INSERTABLE AXIAL WIREWAYS AND METHOD OF MAKING THE LAMP filed on Aug. 25, 2003.

As is known, light output of an LED depends on its temperature. LED temperature should be kept low to ensure efficient light production. Accordingly, it is beneficial to provide an LED lamp that includes an LED with a heat sink for drawing heat away from the LED. The LED may be mounted on a post where the post is surrounded by a reflector. A circuit board provides the necessary electrical components and connections for operating the LED. The above-noted related applications and U.S. Pat. No. 6,773,138 disclose examples of such a lamp.

The arrangement of the reflector, heat sink, circuit board, and post in an LED lamp and the efficient assembly of these components have presented problems for designers of such lamps. One of the problems is how to provide an efficient assembly technique for connecting the LED on top of the post to a circuit board at a bottom of the post. In the assembled lamp, heat should be conducted away from the LED at the top of the post to the heat sink at the bottom of the post and electrical connections should be made from the circuit board at the bottom of the post to the LED at the top of the post. The arrangement of these components should facilitate automated manufacture of the lamp.

SUMMARY OF THE INVENTION

An object of the present invention is to provide a novel LED lamp, and a method of assembling the LED lamp, that includes a heat sink, a heat conductive post extended longitudinally from the heat sink where the post has longitudinal faces that each has a longitudinally extending slot therein, and a metal clad circuit board slid into each slot so that each circuit board is in thermal communication with the post where each circuit board has an exterior surface with an LED thereon. A cap may be provided on top of the post abutting lateral end surfaces of the circuit boards to hold the circuit boards in their respective slots. The circuit boards may be formed from a single integral unit that has plural that are folded into respective slots to form the circuit boards. Among other features, sliding insertion of the circuit board into the slot in the heat conductive post and/or retention of the circuit board in the slot by the cap on top of the post and/or the folding arms of a single circuit board facilitate automated manufacture of the lamp.

Other objects and advantages of the invention will be apparent to those of skill in the art of the present invention after consideration of the following drawings and description of preferred embodiments.

DESCRIPTION OF PREFERRED EMBODIMENTS

Figure 1:
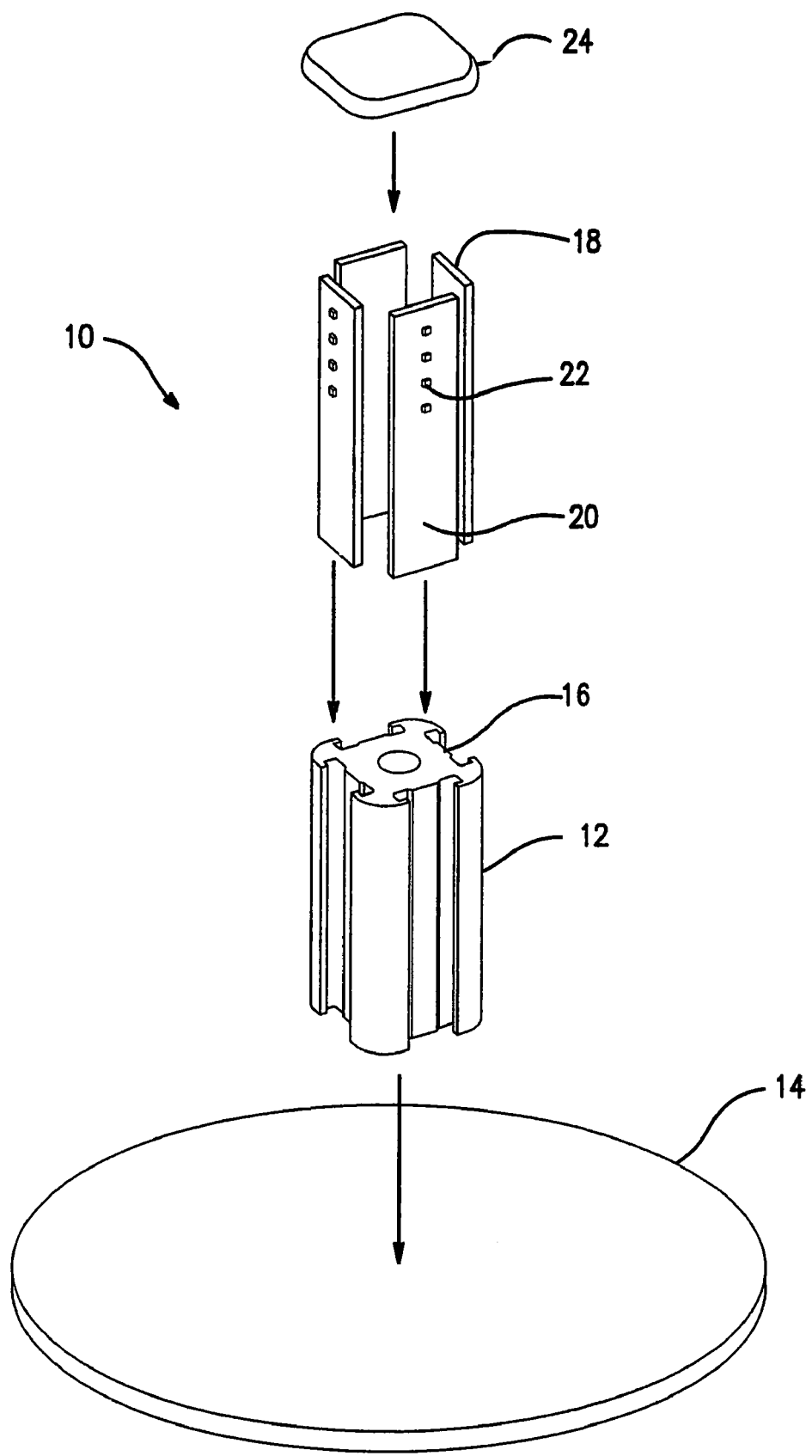
FIG. 1 is an exploded pictorial representation of an embodiment of the lamp of the present invention.
Figure 2:
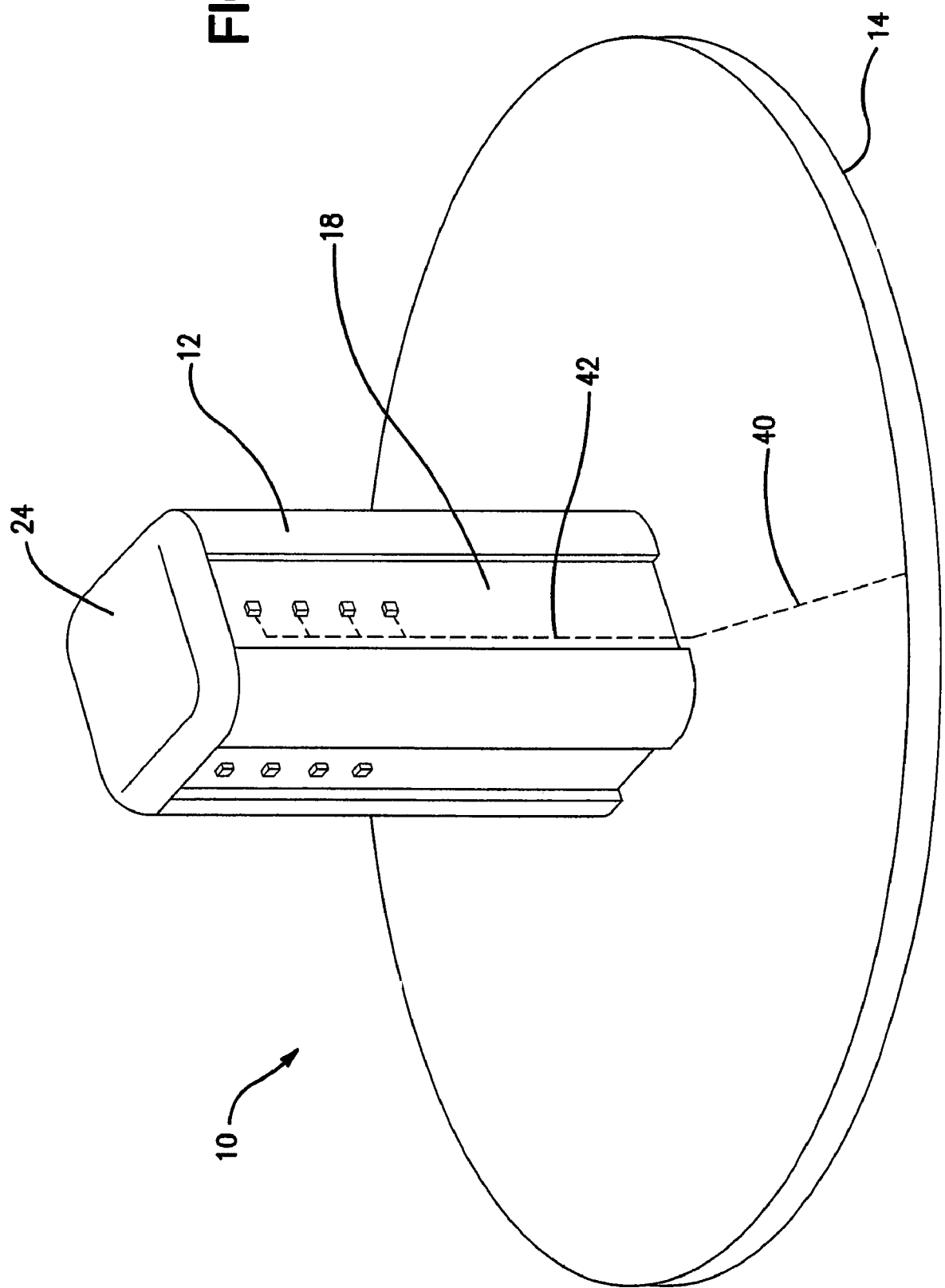
FIG. 2 is a pictorial representation of the lamp of FIG. 1.

With reference now to FIGS. 1–4, an embodiment of the lamp 10 includes a heat conductive post 12 mounted on a heat conductive portion of a base 14, where the post 12 has an exterior face with a longitudinal slot 16 therein. A mounting board 18 is slideably disposed in the slot 16, where the mounting board 18 has an exterior surface 20 with an LED 22 thereon. A retaining cap 24 is attached to the post 12 opposite the base 14. The mounting board 18 may have an interference fit with the slot 16 to hold mounting board 18 in the slot 16 and provide thermal communication between the post 12 and the mounting board 18. Alternatively, or in addition, the cap 24 abuts a lateral end 26 of the mounting board 18 to hold (or help hold) the board 18 in the slot 16.

Figure 4:
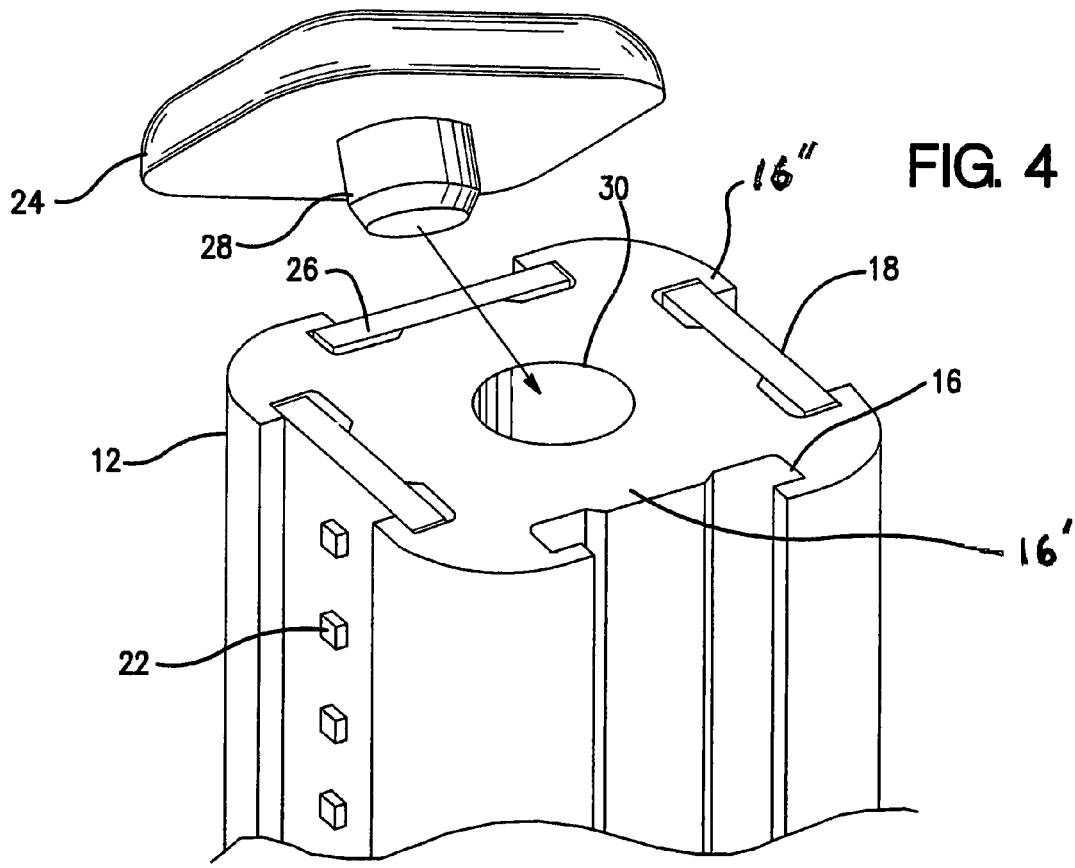
FIG. 4 is a detailed pictorial representation of the end of the heat conductive post to which the retaining cap is attached.

As shown in FIG. 4, each slot 16 may be provided with a longitudinal rib 16' that presses against an interior surface of the respective one of the mounting boards 18 and longitudinal edges of the exterior surface of each of the mounting boards may be held by edges 16" of the respective slot to provide the interference fit.

The method of making the lamp includes the steps of mounting the heat conductive post 12 on the heat conductive portion of the base 14 so that the post 12 and the heat conductive portion of the base 14 are in thermal communication, sliding the mounting board 18 into the slot 16 so as to place the mounting board 18 in thermal communication with the post 12, and making the electrical connections for the LED 22. The mounting board 18 may be held in the slot 16 with the interference fit of the mounting board 18 and/or by mounting the cap 24 on the post so that the cap abuts a lateral end 26 of the mounting board 18.

In the assembled lamp, heat is conducted away from the LED 22 on the post 12 to the heat conductive portion at the bottom of the post. Automated manufacture of the lamp is facilitated by sliding insertion of the mounting board 18 into the slot 16 and/or retention of the mounting board 18 in the slot 16 by the cap 24.

In a more particular embodiment, the post 12 has N (N>2) exterior faces and a cross section that is constant along an entire length of the post, such as shown in FIGS. 1–4. The cross section of the post may be other than square, such as a triangle, rectangle, pentagon, octagon, and the like. Further, the cross section may be unsymmetrical, or may be radially symmetrical (meaning that one face can be rotated X degrees and symmetrically replace another face). The flat sides of the post 12 and a constant cross section facilitate insertion of the mounting board 18. As is apparent, providing the slot 16 with parallel sides and making the mounting board 18 slightly smaller than the slot 16 further facilitates the assembly. The post 12 may be made of extruded aluminum or other suitable heat conductive material.

The cap 24 preferably has the same number of sides as the post, although other shapes are possible (e.g., round) provided the cap abuts a lateral end surface of each mounting board 18 when the cap 24 is to be used to hold the mounting board 18 in the slot 16. The cap may have a projection 28 that snap-fits into a corresponding cavity 30 in a top of the post 12. The cap may have a decorative color and shape.

The mounting board 18 may include a first electrical circuit 42 that is connected to the LED (shown in dashed lines in FIG. 2 to indicate that these may be internal circuits) and base 14 may include a second electrical circuit 40, where the first and second electrical circuits are connected to each other to connect the LED to the second electrical circuit.

Figure 5:
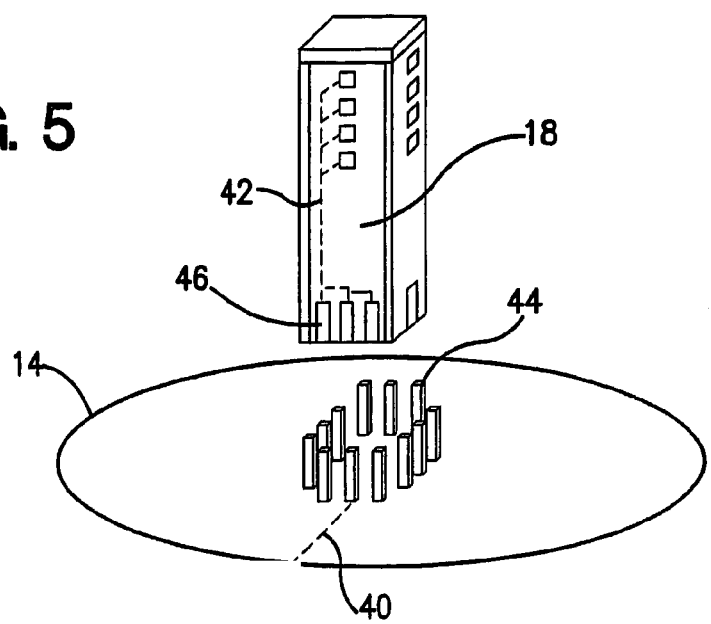
FIG. 5 is a schematic representation of an electrical connection between the mounting board and the base.
Figure 6:
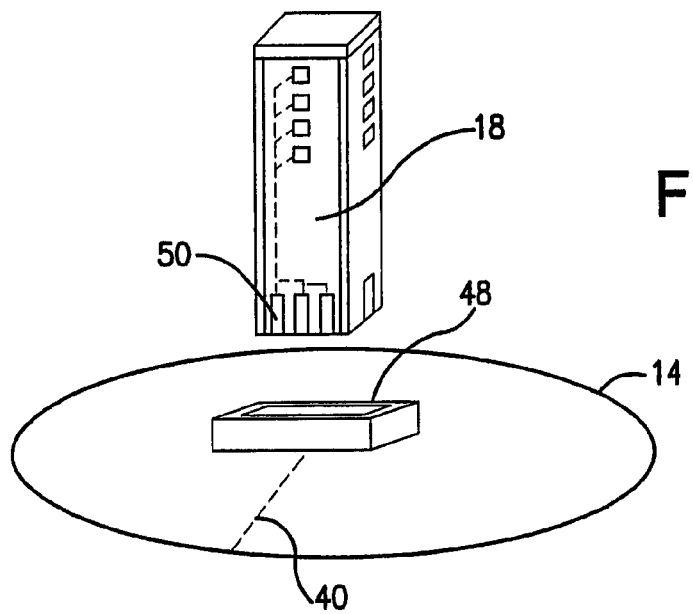
FIG. 6 is a schematic representation of another electrical connection between the mounting board and the base.
Figure 7:
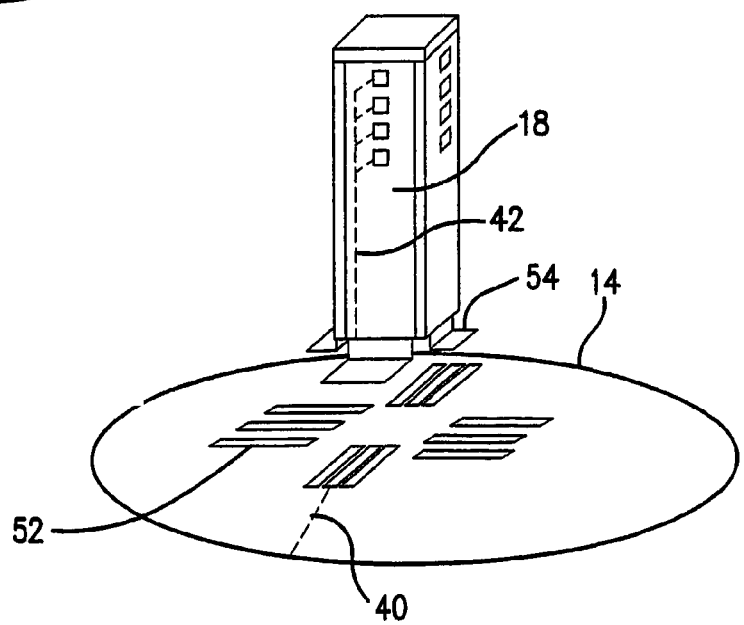
FIG. 7 is a schematic representation of a further electrical connection between the mounting board and the base.

With reference now to FIGS. 5–7, connection of the first and second electrical circuits to each other may be accomplished by one of several means for connecting the circuits to each other. For example, the second electrical circuit 40 may include plural pins 44 that extend longitudinally from the base 14, the first electrical circuit 42 may include plural sockets 46 that are attached to the mounting board 18, and respective ones of the plural pins 44 and sockets 46 may be joined to each other to electrically connect the LED to the second electrical circuit. By way of further example, as shown in FIG. 6, the second electrical circuit 40 may include a socket 48 on the base 14, the first electrical circuit 42 may include plural contacts 50 that fit into the socket 48, and the socket 48 and plural contacts 50 may be joined to each other to electrically connect the LED to the second electrical circuit. Alternatively, the second electrical circuit 40 may include plural contact pads 52 on the base 14, the first electrical circuit 42 may include plural contact fingers 54 that extend from the mounting board 18, and respective ones of the plural contact pads 52 and plural contact fingers 54 may be joined to each other to electrically connect the LED to the second electrical circuit.

Each mounting board 18 may include plural LEDs 22 that are longitudinally aligned. The LEDs may be packaged dies or chip-on-board mounted. The mounting board 18 may be a metal clad circuit board with greater rigidity than non-metal clad boards so as to provide improved thermal communication between the LED 22 and the board 18 and the board 18 and the post 12. The first electrical circuit 42 may be a printed circuit or the like.

The base 14 may be a metal clad circuit board or a heat sink 14' (FIG. 3), or a combination. If the base is a metal clad circuit board, a separate heat sink may also be needed. The second electrical circuit 40 may be a circuit board attached to the heat sink or may be circuitry on the heat sink. The second electrical circuit may be on either side of the base and may include a suitable external connection (FIG. 3) for the lamp that may include a connection housing 60 and pins 61.

Figure 3:
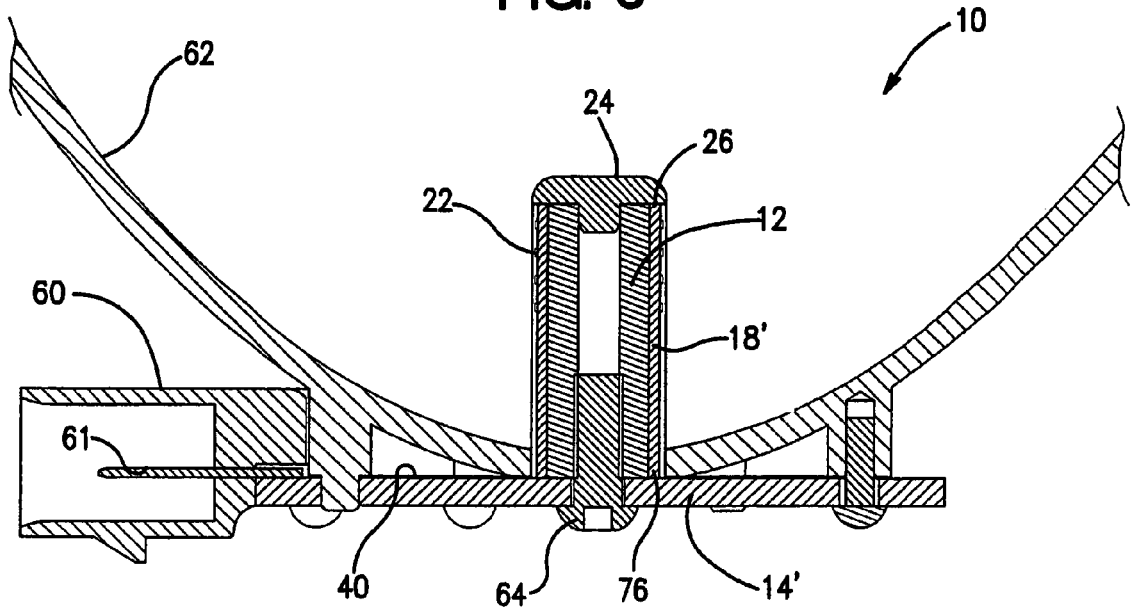
FIG. 3 is a cross section of an embodiment of the lamp of the present invention.
Figure 8:
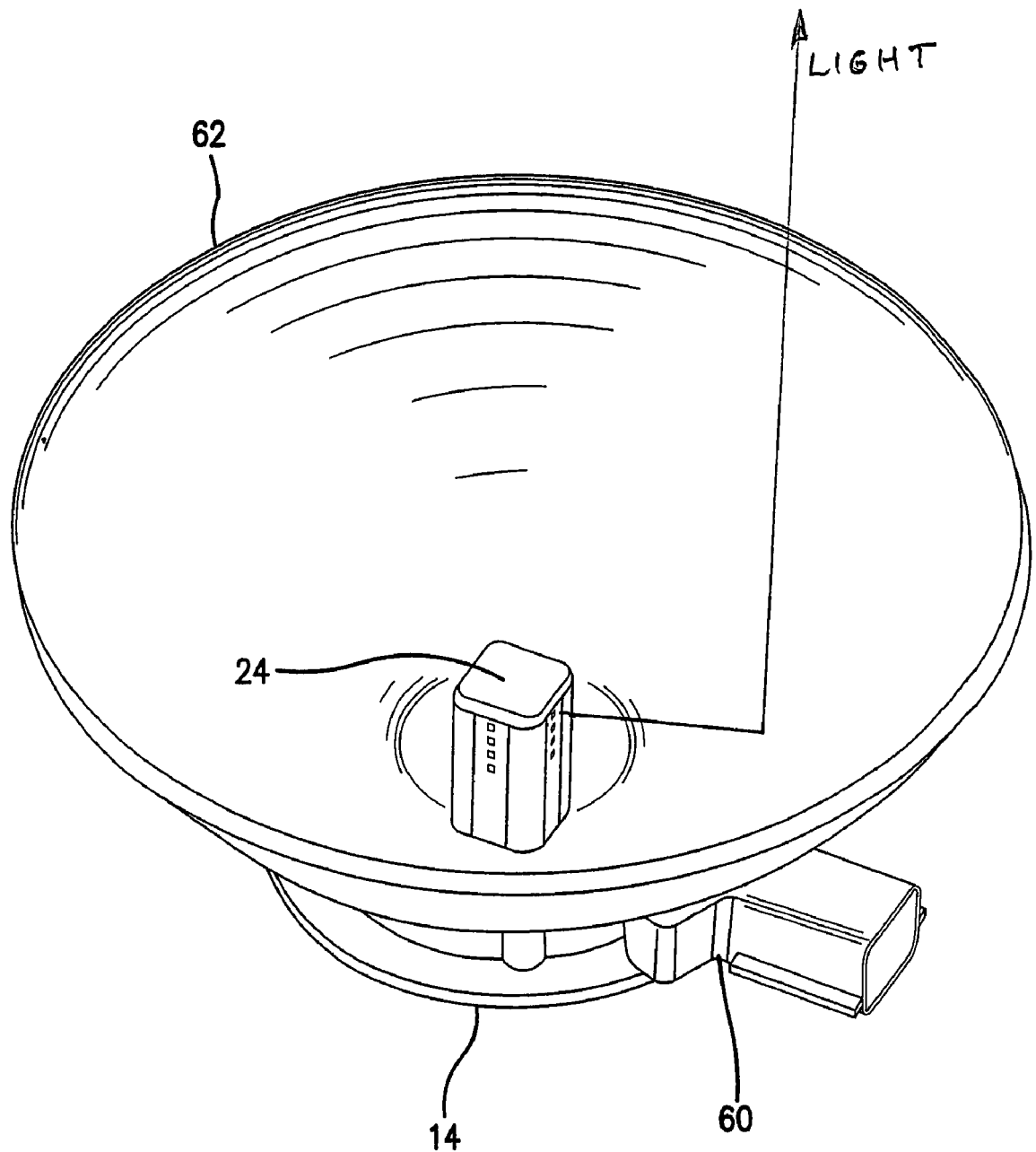
FIG. 8 is a pictorial representation of the lamp of the present invention with a reflector.

As shown in FIGS. 3 and 8, a reflector 62 that reflects light from the LED 22 may be provided as part of the lamp. Alternatively, the post and base may be inserted into an existing reflector. Suitable fasteners may be provided for joining the base and reflector. The reflector may be parabolic or the like and the LED 22 may be placed near the focal point of the reflector. The post may be joined to the base by a fastener 64 that extends through the base into a bottom of the post.

Figure 9:
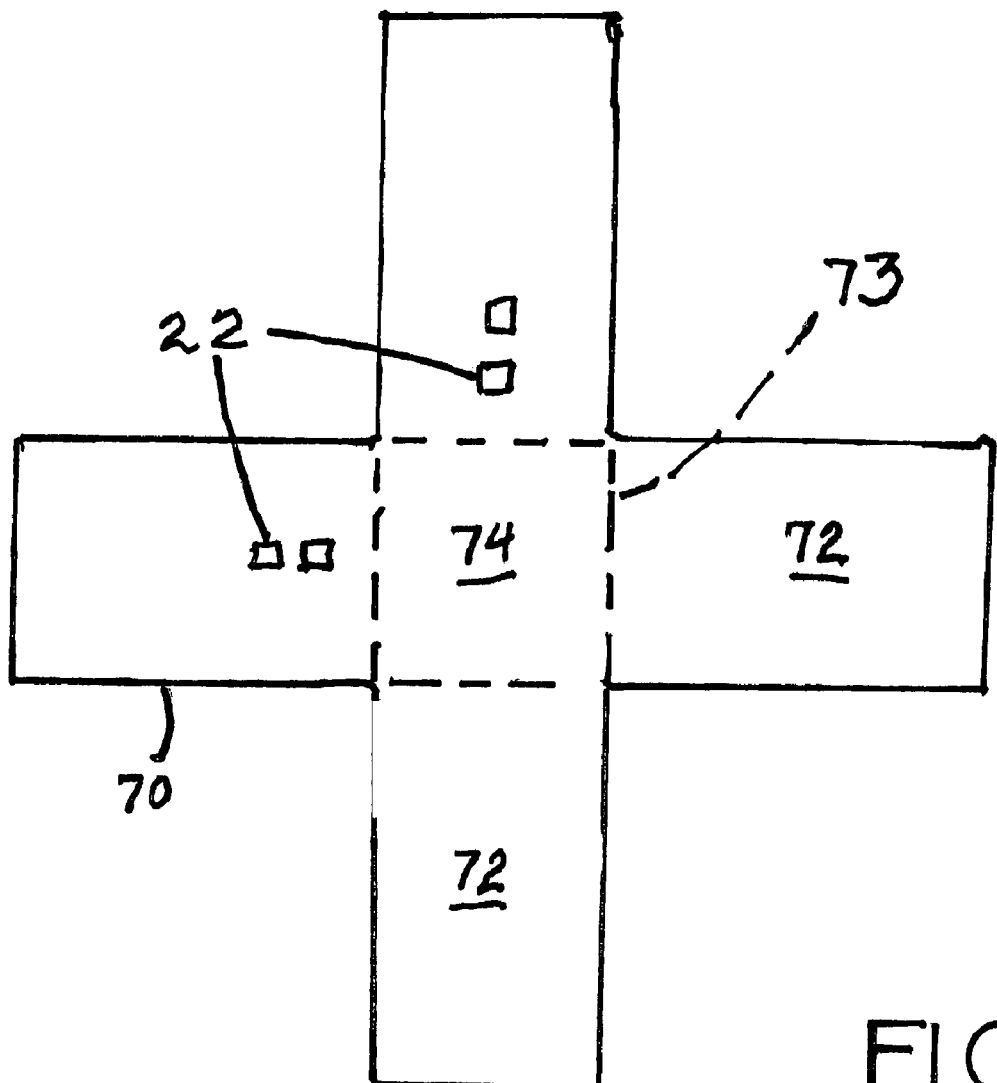
FIG. 9 is a pictorial representation of a folding mounting board in a further embodiment of the present invention.

In a further embodiment shown in FIG. 9, a mounting board 70 may be a single piece of flexible circuit board with plural arms 72 that are each folded at a fold line 73 to fit into respective ones of the slots 16 of the post 12. Each arm 72 may have the LEDs 22 and appropriate electrical circuitry preassembled thereon. The center 74 of the mounting board 70 rests on top of the post 12 when the arms 72 are slid all the way into their respective slots. The mounting board 70 may be provided with a suitable connection for a cap 24, which is optional in this embodiment. The combined pressure of the interference fit of the arms 72 in the slots 16 holds the mounting board 70 on the post 12. This technique further facilitates manufacture of the lamp.

With reference again to FIG. 3, a more particular embodiment of the lamp includes a heat sink 14' having second electrical circuit 40 thereon, and a heat conductive post 12 extending longitudinally from the heat sink 14', where the post 12 has a bottom in thermal communication with the heat sink 14' and the post 12 has plural longitudinal faces that each has a longitudinally extending slot 16 therein. Metal clad circuit boards 18' are each slideably arranged in a respective one of the slots so that each of the circuit boards 18' is in thermal communication with the post 12. Each of the circuit boards 18' has (a) a first lateral end surface 76 abutting the heat sink 14' and/or the second electrical circuit 40, (b) an exterior longitudinal surface with at least one LED 22 thereon, and (c) first electrical circuit 42 adjacent to the first lateral end surface of the circuit board that connects to the second electrical circuit. A cap 24 is provided on a top of the post 12 opposite the heat sink 14', where the cap 24 holds each of the circuit boards 18' in a respective slot 16 and the cap 24 abuts the lateral end surface 26 of each of the circuit boards so that each of the circuit boards 18' is captured between the cap 14 and one of the heat sink 14' and the first electrical connection 40.

While embodiments of the present invention have been described in the foregoing specification and drawings, it is to be understood that the present invention is defined by the following claims when read in light of the specification and drawings.

We claim:

1. A lamp comprising:
   a heat conductive post mounted on a heat conductive portion of a base, said post having plural exterior faces, each with a longitudinal slot therein;
   plural mounting boards, each slideably disposed in said slot, each said board having an exterior surface with an LED thereon, each said board being in thermal communication with said post and having a first electrical circuit for said LED, and
   wherein said plural mounting boards are integrally joined with a center portion that rests on a top of said post, and wherein fold lines define a periphery of said center portion.

2. The lamp of claim 1, further comprising a cap on said post opposite said base, said cap abutting a lateral end of said board and holding said board in said slot.

3. The lamp of claim 1, wherein a cross section of said post is constant along an entire length of said post.

4. The lamp of claim 1, wherein said base comprises a second electrical circuit that is connected to said first electrical circuit.

5. The lamp of claim 4, wherein Said second electrical circuit comprises plural longitudinally extended pins, wherein said first electrical circuit comprises plural sockets, and wherein respective ones of said plural pins and sockets are joined to each other to electrically connect said LED to said second electrical circuit.

6. The lamp of claim 4, wherein said second electrical circuit comprises a socket, wherein said first electrical circuit comprises plural contacts, and wherein said socket and plural contacts are joined to each other to electrically connect said LED to said second electrical circuit.

7. The lamp of claim 4, wherein said second electrical circuit comprises plural contact pads, wherein said first electrical circuit comprises plural contact fingers, and wherein respective ones of said plural contact pads and plural contact fingers are joined to each other to electrically connect said LED to said second electrical circuit.

8. The lamp of claim 1, wherein said board comprises plural ones of said LED that are longitudinally aligned.

9. The lamp of claim 1, further comprising a reflector arranged to reflect light from said LED.

10. A lamp comprising:
a heat sink having a first electrical circuit thereon;
a beat conductive post extending longitudinally from said heat sink, said post having a bottom in thermal communication with said heat sink, said post having plural longitudinal faces that each has a longitudinally extending slot therein;
plural metal clad circuit boards that are each slideably arranged in a respective said slot so that each of said circuit boards is in thermal communication with said post, each of said circuit boards having (a) a first lateral end surface abutting one of said heat sink and said first electrical circuit, (b) an exterior longitudinal surface with at least one LED thereon, and (c) a second electrical circuit that connected to said LED and to said first electrical circuit; and
wherein said plural circuit boards are integrally joined with a center portion that rests on a top of said post, and wherein fold lines define a periphery of said center portion.

11. The lamp of claim 10, further comprising a cap on a top of said post opposite said heat sink that holds each of said circuit boards in a respective said slot.

12. The lamp of claim 10, wherein each said slot comprises a longitudinal rib that presses against an interior surface of the respective one of said circuit boards and wherein longitudinal edges of the exterior surface of each of said circuit boards are held by edges of the respective said slot to hold said circuit boards in the respective said slot.

* * * * *